United States Patent

Saitoh

[11] Patent Number: 6,093,964
[45] Date of Patent: Jul. 25, 2000

[54] CONNECTION STRUCTURE UTILIZING A METAL BUMP AND METAL BUMP MANUFACTURING METHOD

[75] Inventor: Kazuto Saitoh, Ohmihachiman, Japan

[73] Assignee: International Business Machines Corporation, Armonk, N.Y.

[21] Appl. No.: 08/850,189

[22] Filed: May 2, 1997

[30] Foreign Application Priority Data

Jun. 27, 1996 [JP] Japan .................... 8-167784

[51] Int. Cl.$^7$ .................................. H01L 23/28
[52] U.S. Cl. .................... 257/738; 257/748; 257/772; 257/778
[58] Field of Search ................... 257/737, 738, 257/748, 772, 778, 779, 781; 251/737, 740; 438/612–614

[56] References Cited

U.S. PATENT DOCUMENTS

| | | | |
|---|---|---|---|
| 3,599,123 | 8/1971 | Krause | 333/30 R |
| 4,645,166 | 2/1987 | Henein et al. | 228/123 |
| 4,930,001 | 5/1990 | Williams | 357/71 |
| 5,071,787 | 12/1991 | Mori et al. | 438/614 |
| 5,101,465 | 3/1992 | Murphy | 385/88 |
| 5,226,232 | 7/1993 | Boyd | 29/846 |
| 5,348,214 | 9/1994 | Nishiguchi et al. | 228/180.22 |
| 5,367,765 | 11/1994 | Kusaka | 29/840 |
| 5,436,503 | 7/1995 | Kunitomo et al. | 257/737 |
| 5,553,182 | 9/1996 | Haake | 385/89 |
| 5,641,996 | 6/1997 | Omoya et al. | 257/787 |
| 5,670,826 | 9/1997 | Bessho et al. | 257/737 |
| 5,672,913 | 9/1997 | Baldwin et al. | 257/737 |
| 5,698,465 | 12/1997 | Lynch et al. | 438/125 |
| 5,808,360 | 9/1998 | Akram | 257/738 |
| 5,854,514 | 12/1998 | Roldan et al. | 257/746 |

OTHER PUBLICATIONS

Applicants Admitted Prior Art (Figure 2).

*Primary Examiner*—Wael Fahmy
*Assistant Examiner*—Kurt Eaton
*Attorney, Agent, or Firm*—Ira D. Blecker

[57] ABSTRACT

A metal bump structure constituted by forming a second metal layer on a first metal layer is used which meets the conditions that the first metal layer is not melted at the time of reflow heating for connecting a substrate with a semiconductor chip and the second metal layer is made of a metal producing no composition causing the reliability to deteriorate between the second metal layer and a solder portion formed on the substrate at the time of reflow heating for connecting the substrate with the semiconductor chip.

17 Claims, 4 Drawing Sheets

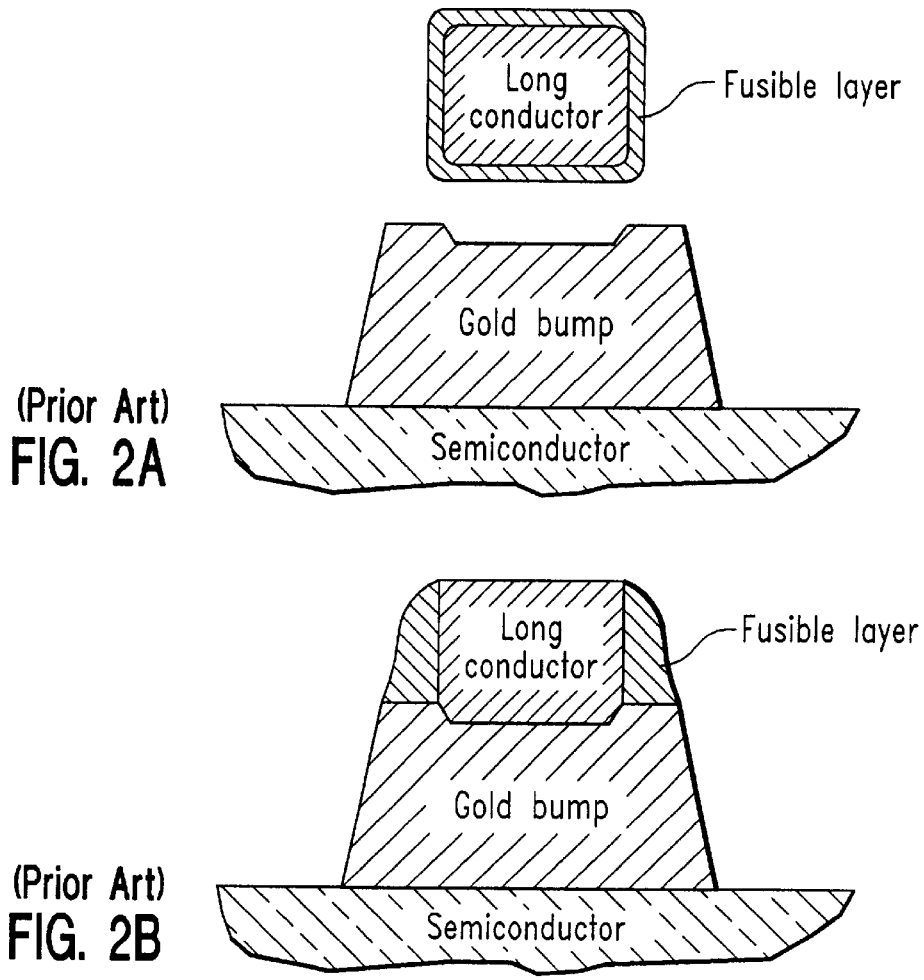
(Prior Art)
FIG. 2A
(Prior Art)
FIG. 2B
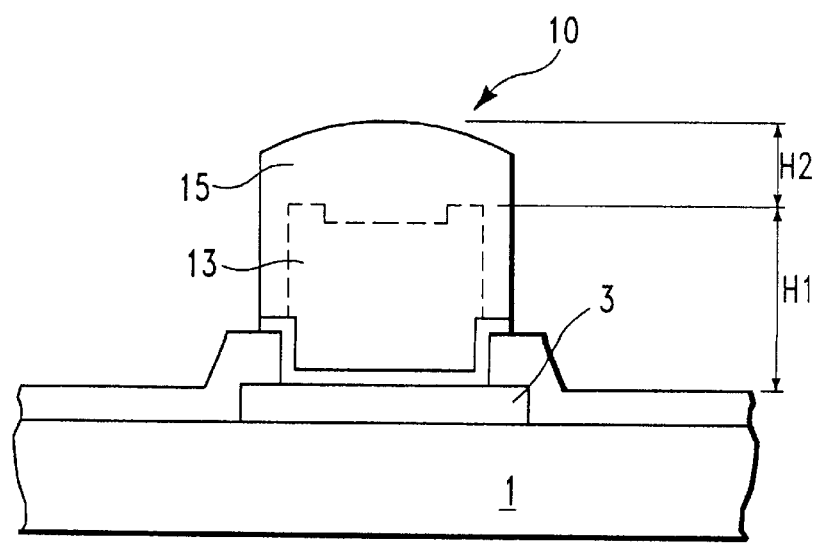
FIG. 3

CONNECTION STRUCTURE UTILIZING A METAL BUMP AND METAL BUMP MANUFACTURING METHOD

FIELD OF THE INVENTION

The present invention relates to a structure of a metal bump to make electrical connection when mounting a semiconductor chip on a printed circuit board (hereafter referred to as board). Particularly, the present invention relates to a structure of a metal bump set between a semiconductor chip and a substrate when performing the flip chip mounting or TAB-type mounting.

BACKGROUND OF THE INVENTION

To mount a semiconductor chip on a substrate, it is necessary to electrically connect an electrode formed on the semiconductor chip and a conductor formed on the substrate. The most general method as the above connection method uses the wire bonding method in which a chip is turned upward and secured to a substrate, and an electrode formed on the chip and a conductor pad formed on the substrate are connected to each other by a thin metal wire (gold wire is mainly used). This method is effective for a semiconductor chip having a relatively simple structure even at present and it is a leading method of connection methods for connecting a semiconductor chip with a substrate.

However, when the structure of a chip is complex, it is necessary to bond a great number of wires on a chip and thus, the cost remarkably increases or a lot of time is required for bonding. Therefore, a wireless bonding method was developed which connects a semiconductor chip onto a substrate without using a bonding wire. The flip chip method and the TAB method are typical ones of the wireless bonding method.

The flip chip method is a method for directly connecting a conductive pad formed on a substrate with an electrode formed on a semiconductor chip by turning the chip downward and bringing the chip turned downward into contact with the substrate. The TAB method is a method for connecting a long conductor (hereafter referred to as a lead) formed on a TAB tape with a semiconductor chip and thereafter, cutting a tape to leave only a part of the lead and connecting an end of the lead with a conductive pad formed on a substrate.

Any one of these wireless bonding methods realizes electrical connection through a metal bump formed on an electrode of a semiconductor chip. For example, in the case of the flip chip method, a metal bump is formed on an electrode of a semiconductor chip to keep the interval between the semiconductor chip and a substrate constant.

Connection between a metal bump and a substrate is performed by using solder formed on a conductive pad of the substrate as a brazing filler material and melting the material. Moreover, in the case of the TA method, a metal bump is formed on an electrode of a semiconductor chip and serves as a contact point with a lead formed on a TAB. In the case of the TAB method, a fusible metal layer made of, for example, tin formed so as to cover a lead serves as a brazing filler for connecting a metal bump and the lead.

Problems of the flip chip method are described below in detail. Gold is mainly used as a metal bump. A metal bump is connected with a substrate by previously forming solder serving as a brazing filler for connection on the substrate like a bump by a method such as injection, aligning the solder bump with a gold bump formed on a chip, and thermally melting (reflowing) the solder bump. The solder bump used in the above case is fusible solder made of indium, tin, and lead.

However, the above conventional method has the following problems.

Firstly, when using a gold bump for the flip chip method, the solder composition of a solder bump formed at the substrate side is restricted to a certain condition. For example, it is impossible to use the most general binary-system solder made of tin and lead. This is because, when a junction is formed by using the above composition, gold-tin eutectic is formed on the interface between a gold bump and a solder layer and thereby, the connection reliability is deteriorated. In this case, the connection reliability denotes that the present connection state can be maintained because a joint is physically and chemically stable under the working condition. Secondly, a recess with a depth of several microns is easily formed on the top of a gold bump and thereby, a void is produced at the interface between the gold bump and a solder layer when a chip is mounted.

The above described first point further includes the following two problems. Firstly, the cost of indium-based solder increases. Moreover, it is necessary to previously form a solder bump by a method such as injection and thereby, the process cost increases. In the field of semiconductor mounting in which reduction of fabrication cost is a supreme subject, increase of unnecessary cost must be prevented.

The above described second point is more minutely described below by referring to FIG. 1. FIG. 1 is a schematic view of a cross section when making connection by using a bump with a recess at its top. As shown in FIG. 1, small voids are produced at the top of the bump because bubbles present in the recess cannot escape at the time of solder reflow. A joint including a lot of voids of the above type has a problem in its reliability.

Then, problems of the TAB method are described below.

FIGS. 2A and 2B show schematic views of the TAB method. To make connection by the TAB method, a lead at the TAB side (normally made of copper) is plated with a fusible metal such as tin to make connection with a bump formed on a semiconductor chip. In FIGS. 2A and 2B show a lead is formed on a TAB tape (not illustrated) and extends in the direction vertical to the paper surface. At least a part of the lead is plated with a fusible metal to serve as a brazing filler for connection with the bump formed on the semiconductor chip. The bump is connected with the lead by making them contact each other and heating and contact-bonding them.

However, even in the case of this method, it is necessary to plate a lead with a fusible metal layer serving as a brazing filler material because a bump normally uses gold. Therefore, increase of process cost cannot be avoided.

As described above, though the flip chip method and the TAB method has a superior aspect as the wireless bonding method, it is necessary to further improve the cost and reliability. The present invention solves these problems by improving the structure of a metal bump formed on a semiconductor chip.

The first object of the present invention is to provide a metal bump formed on a semiconductor chip to connect the semiconductor chip with a substrate, a metal bump structure having a preferable compatibility with many types of solder for connection according to the flip chip method, and its manufacturing method.

The second object of the present invention is to provide a metal bump formed on a semiconductor chip to connect the semiconductor chip with a substrate, a metal bump structure having a smooth top and preventing the connection reliability from deteriorating for connection according to the flip chip method, and its manufacturing method.

The third object of the present invention is to provide a metal bump formed on a semiconductor chip to connect the semiconductor chip with a lead formed on a TAB tape without using a fusible metal layer on a lead, and its manufacturing method.

The Forth object of the present invention is to solve the above problems on flip chip mounting and TAB mounting by providing a substitute structure of a gold bump according to the prior art and a method for forming the substitute structure.

BRIEF SUMMARY OF THE INVENTION

The present invention relates to a connection structure utilizing a metal bump structure formed on a semiconductor chip to connect the semiconductor chip with a substrate. The above-described objects can be achieved by a metal bump structure in which a second metal layer is formed on a first metal layer and which meets the conditions that the first metal layer is not melted at the time of reflow heating for connecting a substrate with a semiconductor chip and the second metal layer is made of a metal not forming any composition causing the reliability to deteriorate between the substrate and a solder portion formed on the substrate at the time of reflow heating for connecting the substrate and the semiconductor chip. Though gold is typically listed as an example of the first metal layer, the expected object can also be achieved by silver, copper, or an alloy of these metals. Moreover, though indium is typically listed as an example of the second metal layer, the expected object can also be achieved by tin, lead, bismuth, or an alloy of these metals. Furthermore, the composition causing the reliability to deteriorate includes every composition deteriorating electrical and mechanical characteristics of a joint such as an eutectic composition between a bump forming element and solder, for example, a tin-gold eutectic composition or an intermetallic compound inferior in ductility, which causes a problem when directly reflowing fusible solder on a gold bump in accordance with the prior art.

BRIEF DESCRIPTION OF THE DRAWINGS

FIGS. 2A and 2B show a schematic view for explaining the connection in accordance with the TAB method in the case of the prior art;

FIG. 3 shows a sectional view of a bump structure of the first embodiment of the present invention;

DETAILED DESCRIPTION OF THE INVENTION

Figure 1:
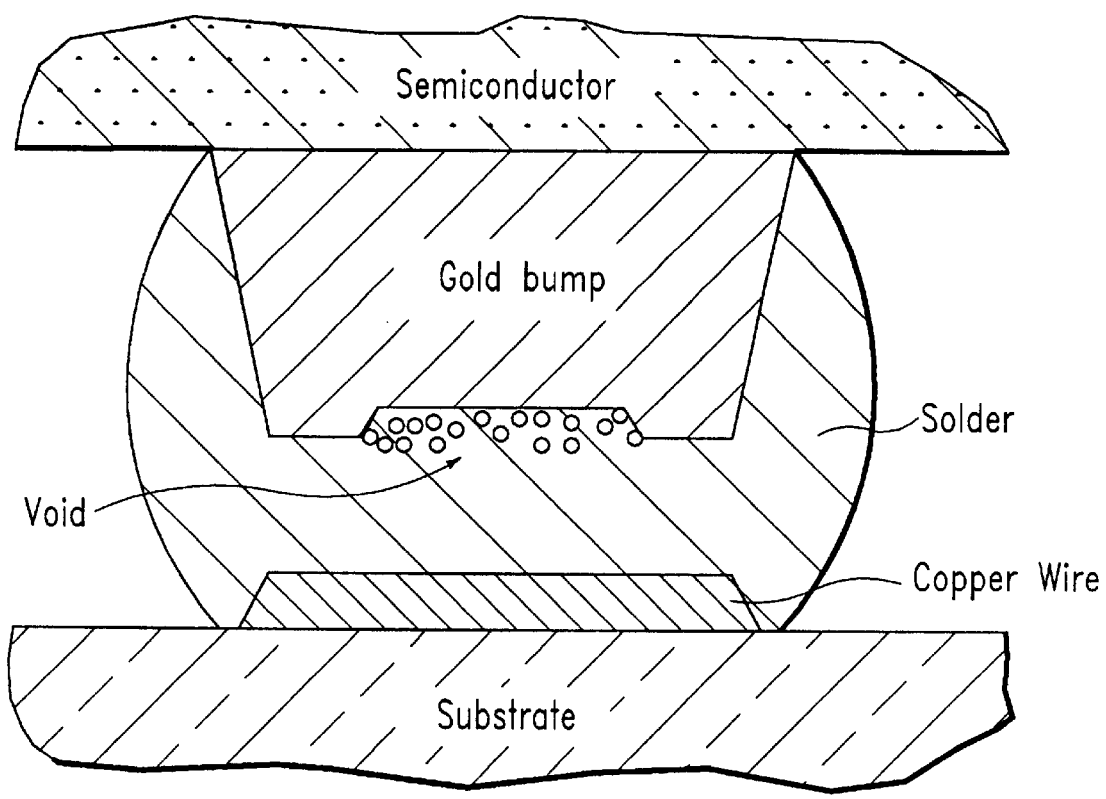
FIG. 1 shows a schematic view of occurrence of voids in the case of the prior art.

The present invention when using gold for a first metal layer and indium for a second metal layer is described below in detail by referring to the accompanying drawings. FIG. 3 discloses a bump structure 10 of an embodiment of the present invention. The bump structure 10 of the present invention is characterized in that at least a part of the circumference of a gold layer 13 serving as a core material or preferably the whole of the top of the layer 13 is covered with an indium later 15. The bump 10 is formed on an electrode 3 on a semiconductor chip 1.

Figure 4:
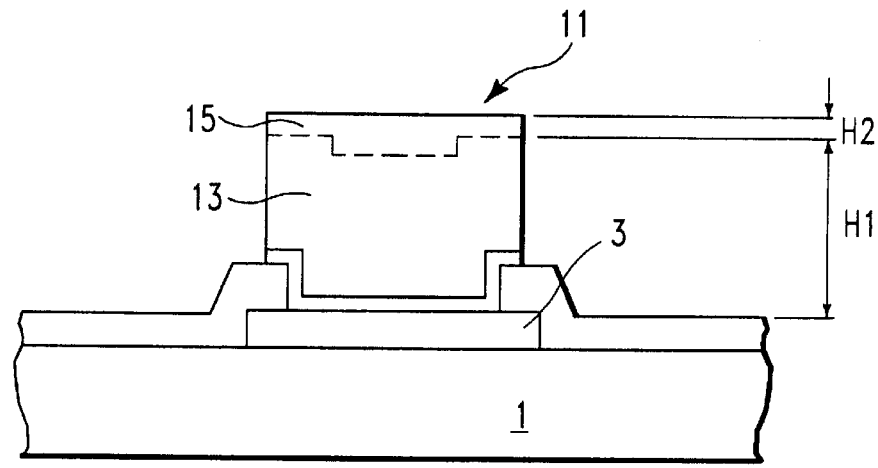
FIG. 4 shows a sectional view of a bump structure of the second embodiment of the present invention.

FIG. 4 discloses a bump structure 11 of another embodiment of the present invention. As disclosed in FIG. 4, an indium layer 15 can realize the advantages of the present invention even if the layer 15 is present only on the top of the gold layer 13.

The structure of the present invention makes it possible to solve the above problems in accordance with the flip chip method because of the reasons described below. Firstly, because a portion directly connecting with a solder bump formed on the substrate side is made of indium, no harmful composition is produced at the interface between the portion and the solder bump even if eutectic solder made of lead and tin is used as a solder bump formed at the substrate side. Moreover, by flattening the top surface of the indium later 15 by a proper method, it is also possible to prevent voids from being produced at the interface. In the case of the TAB method, indium serves as a brazing filler material between a bump and a lead by reflow because it has a low melting point. Therefore, it is unnecessary to form a fusible metal layer serving as a brazing filler material on the lead surface.

Figure 5:
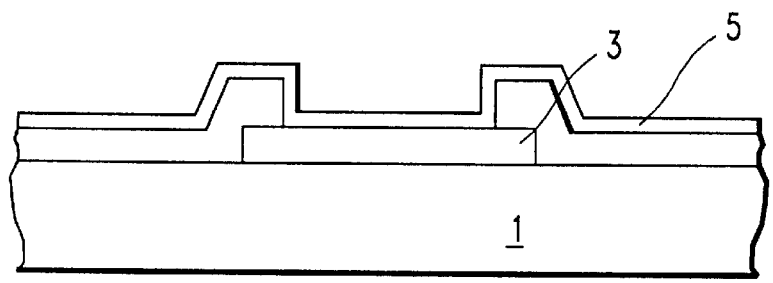
FIGS. 5, 6 and 7 show a method for manufacturing a bump structure of the first embodiment of the present invention.

A method for manufacturing a structure of the present invention is described below. Firstly, as shown in FIG. 5, an oxide film is removed from the surface of an electrode 3 formed on a semiconductor substrate 1 by a proper method such as RF plasma etching. Then, a metal film 5 comprising a plurality of layers is formed on the whole surface by a method such as sputtering. It is preferable for the metal film to have the composition of TiW—Au or Ti—Pd—Au.

Figure 6:
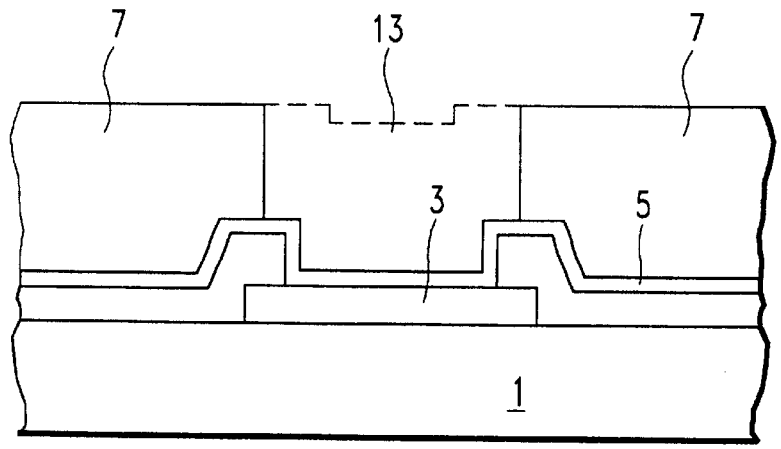
Figure 7:
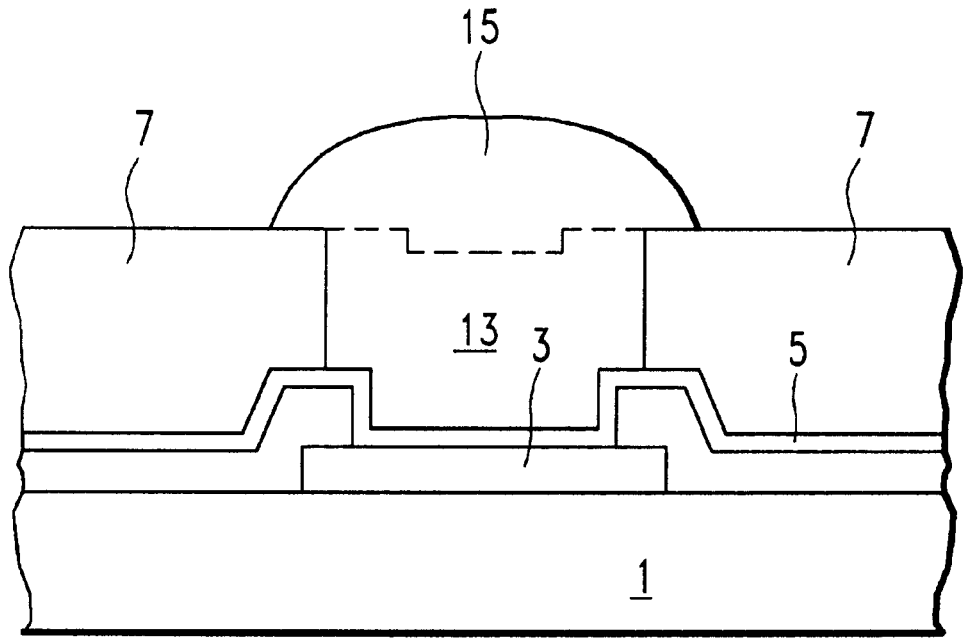

Then, as shown in FIG. 6, photoresist 7 is applied as a plating mast and thereafter, only the top of the electrode 3 is opened. Then, a gold layer 13 is formed by means of plating or the like by using the metal film 5 as a common electrode. The gold layer 13 is formed up to a thickness almost equal to that of the photoresist 7. Moreover, in this case, it is preferable to use electroplating for the above plating and typically perform the electroplating by heating a bath to a temperature slightly higher than room temperature (e.g. 50 to 60° C.) at a current density of 0.4 to 1 A/dm$^2$. The gold layer 13 serves as a spacer for keeping the interval between a substrate and a semiconductor chip constant at the time of connection with the substrate. Moreover, as shown in FIG. 7, an indium layer 15 is formed on the gold layer 13. A bath temperature of 40 to 50° C. and a current density of 2 to 3 A/dm$^2$ are the plating conditions of the indium layer 15. Thereafter, the photoresist 7 and the metal film 5 are removed. Finally, by heating the indium layer 15 at a constant temperature to reflow the layer 15, the structure shown in FIG. 3 is obtained in which the indium layer 15 is formed around the gold layer 13. The reflow temperature is typically 160° C. or higher. Then, in this case, the indium layer 15 is formed so as to entirely cover the gold layer 13.

It is permitted to reflow the indium layer 15 before removing the photoresist 7. In this case, it is possible to reflow the layer 15 at a temperature slightly lower than the temperature when reflowing the layer 15 after removing the photoresist 7. Moreover, it is possible to reflow the indium layer 15 after applying a flux. In this case the indium layer 15 is not oxidized during reflow and it is formed so as to cover the gold layer 13.

Figure 8:
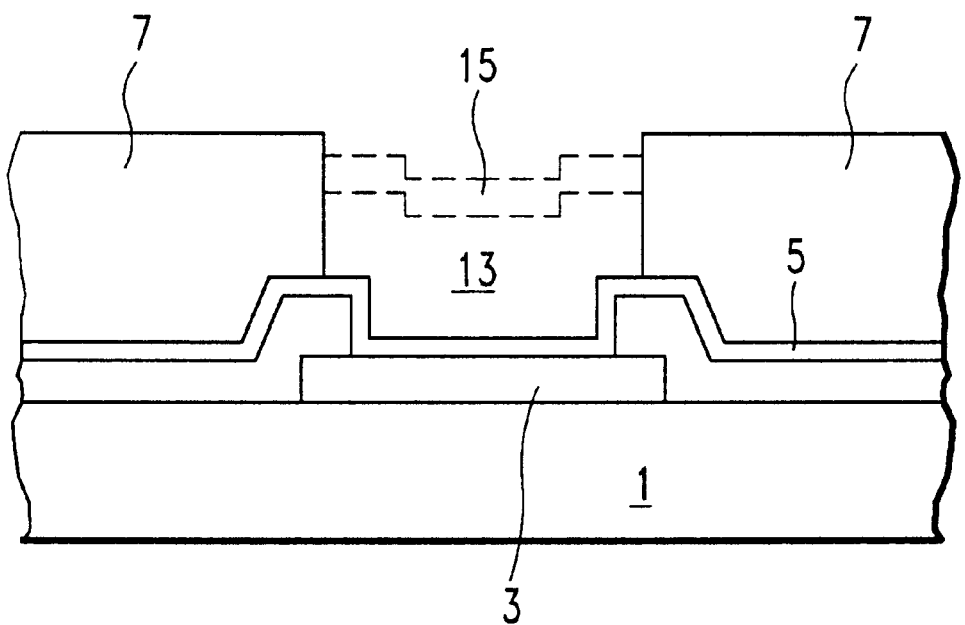
FIG. 8 shows a method for manufacturing a bump structure of the second embodiment of the present invention.

It is possible to obtain the structure shown in FIG. 4 depending on the relation of a relative height between photoresist layer 7 and the gold layer 13. For example, as shown in FIG. 8, by forming the gold layer 13 so that the height of the layer 13 is lower than that of the photoresist 7, the indium layer 15 formed on the gold layer 13 does not exceed the height of the photoresist 7. Therefore, by removing the photoresist 7 and the metal film 5 and performing reflow, the bump structure shown in FIG. 4 can be obtained.

Table 1 shows quantitative values of a structure obtained by the present invention, which are quantitative values of a bump structure of the present invention for performing mounting in accordance with the flip chip method. In Table 1, the embodiment 1 has the structure for covering the whole of a gold layer by indium shown in FIG. 3 and the embodiment 2 has the structure for forming an indium layer only on the top of a gold layer shown in FIG. 4. Moreover, H1 and H2 (shown in FIGS. 3 and 4) denote the thickness (height) of the gold layer and that of the indium layer respectively and V1 and V2 denote the volume of the gold layer and that of the indium layer respectively.

TABLE 1

|         | Embodiment 1 | Embodiment 2 |
|---------|--------------|--------------|
| H1 ($\mu$m) | 30–90        | 30–90        |
| V2/V1   | 1–5          | 0.2–1        |

In this case, for H1>90 $\mu$m, the fluctuation of heights of formed bumps increases and therefore, and imperfect connection may occur between a chip and a substrate. Moreover, For H1<30 $\mu$m, the distance between a chip and a substrate for connection decreases to cause the connection reliability to deteriorate. Therefore, it is preferable to set H1 to the values shown in Table 1.

Furthermore, for V2/V1>5, the amount of indium excessively increases and thereby, a short circuit easily occurs between bumps when connection with a substrate. However, when decreasing V2/V1, it is impossible to completely cover at least the whole of the top of a gold layer and thus, it is impossible to obtain the expected advantage of the present invention. The amount of indium capable of completely covering the whole of the top of a gold layer depends on the size of a recess formed at the top of the gold layer. Therefore, it is difficult to determine a clear lower limit of V2/V1. Moreover, the parameter of V2/V1 correlates to a ratio H2/H1 between heights of metal layers. In the case of a typical embodiment, the case of 0.02<V2/V1<5 corresponds to 0.03<H2/H1<5.

Moreover, the connection structure between a semiconductor chip and a substrate connected in accordance with the flip chip method by using a bump structure of the present invention is characterized in that:

(1) no void is practically present at the interface between a gold layer and a solder layer, (2) a recess is present at the top of a gold layer, and (3) no harmful composition is present at the interface between a gold layer and a solder layer.

Table 2 shows quantitative values when using a bump structure of the present invention for connection according to the TAB method.

TABLE 2

|         | Embodiment 1 | Embodiment 2 |
|---------|--------------|--------------|
| H1 ($\mu$m) | 15–50        | 15–50        |
| V2/V1   | 1–5          | 0.2–5        |

In the case of the TAB method, it is enough that only an indium layer capable of connecting a lead with a gold layer is formed. Therefore, the embodiment 2 is more useful. However, the embodiment 1 can also be applied. Moreover, in the case of the TAB method, the thermal strain between a chip and a substrate is absorbed by the deflection of a lead. Therefore, the connection reliability can be secured even though the value of H1 is generally smaller than the case of applying the bump structure to the flip chip method. The reason why H1 and V2/V1 respectively have a critical value is the same as the case of a flip chip. However, even for V2/V1>5, a short circuit hardly occurs in the case of the TAB method. However, it is a problem from the viewpoint of material cost that excessive indium is required.

The following is an advantage when using a bump structure of the present invention for the TAB method. That is, because an indium layer directly formed on a metal bump serves as a brazing filler, it is unnecessary to plate the lead on the TAB. Therefore, the plating step is unnecessary and thus, a great reduction of cost can be expected.

The embodiments of the present specification are described by using gold for a first metal layer and indium for a second metal layer. However, the expected object of the present invention is not restricted to the above combination. A lower layer must meet at least the following conditions because of the objects of the present invention.

(1) The lower layer is not melted when it is reflowed. Moreover, from the viewpoint of the manufacturing process, the lower layer must meet the following condition.

(2) The lower layer is easily attached by plating (the lower layer has a preferable compatibility with a base metal film) when a bump is formed.

(3) The fluctuation of the height of the lower layer can be controlled when the layer is plated.

(4) The lower layer has a preferable compatibility with a resist when it is plated.

Furthermore, an upper layer must meet at least the following conditions because of the objects of the present invention.

(1) The upper layer has a preferable compatibility with fusible solder.

(2) The upper layer has a preferable compatibility (e.g. adhesion) with a lower layer when a bump is formed. Moreover, from the viewpoint of the manufacturing process, the upper layer must meet the following conditions.

(3) The fluctuation of the height and volume of the upper layer can be controlled when the layer is plated.

(4) The lower layer has a preferable compatibility with a resist when it is plated.

Therefore, tin, lead, bismuth, and an alloy of these metals can be used in addition to indium as long as they meet the above conditions.

According to the present invention, it is possible to use general solder with the composition of the tin-lead eutectic system as the solder for the substrate side in the case of the flip chip method. Therefore, it is possible to form a solder bump on a substrate not only by injection but also by an inexpensive method using no injection (e.g. super solder method).

According to the present invention, because the top of a bump is flattened in the reflow step while the bump is formed, no void is produced at the interface between a solder bump of the substrate side and a bump of a semiconductor chip in the case of the flip chip method. Therefore, very reliable connection is realized.

According to the present invention, the manufacturing cost can greatly be reduced because it is unnecessary to plate a lead of the TAB side with tin or the like in the case of the TAB method. Moreover, improvement of the productivity of TAB connection can be expected because a chip and a TAB lead can easily and stably be connected to each other at a low temperature by indium serving as a brazing filler material formed at the chip side.

What is claimed is:

1. A connection structure for connecting a semiconductor chip with a substrate, comprising:
   a semiconductor chip;
   a first metal layer formed on said semiconductor chip for connecting a substrate having a solder portion with said semiconductor chip, said first metal layer incapable of melting at the time of reflow heating of the solder portion to connect said semiconductor chip to the substrate;
   a second metal layer formed on said first metal layer prior to connection with the substrate, said second metal layer formed of a composition that does not degrade the connection reliability when reacted with the solder portion formed on said substrate at the time of said reflow heating;
   wherein a ratio V2/V1 of the volume (V2) of said second metal layer to the volume (V1) of said first metal layer is 0.2 to 5.0.

2. The connection structure according to claim 1, wherein said first metal layer is selected from the group consisting of gold, platinum, silver, copper, nickel, and alloys of these metals.

3. The connection structure according to claim 1, wherein said second metal layer is selected from the group consisting of indium, lead, tin, bismuth, and alloys of these metals.

4. The connection structure of claim 1, wherein said first metal layer is gold and the second metal layer is indium.

5. The connection structure according to claim 1, wherein the top of said second layer is flat.

6. The connection structure according to claim 1, wherein said first metal layer has a height of 15 to 90 $\mu$m from the surface of said substrate.

7. A connection structure assembly constituted by a semiconductor chip onto a substrate, comprising:
   a semiconductor chip;
   a substrate having a solder portion formed thereon;
   a first metal layer formed in connection with said semiconductor chip to keep said semiconductor chip apart from said substrate in a predetermined distance;
   a second metal layer formed on said first metal layer, said second metal layer having a melting point lower than that of said first metal layer and said second metal layer formed of a composition that does not degrade the connection reliability when reacted with the solder portion formed on said substrate at the time of reflow heating of the solder portion to connect said semiconductor chip to the substrate, wherein said semiconductor chip with said first and second metal layers is placed in contact with the substrate with the solder portion to form said connection structure assembly;
   wherein a ratio V2/V1 of the volume (V2) of said second metal layer to the volume (V1) of said first metal layer is 0.2 to 5.0.

8. The connection structure according to claim 7, wherein said first metal layer has a recess at its top.

9. The connection structure according to claim 7, wherein no void is present between said first and second metal layers.

10. The connection structure of claim 1 wherein said second metal layer only partially covers said first metal layer.

11. The connection structure of claim 1 wherein said second metal layer entirely covers said first metal layer.

12. The connection structure assembly of claim 7 wherein said second metal layer only partially covers said first metal layer.

13. The connection structure assembly of claim 7 wherein said second metal layer entirely covers said first metal layer.

14. The connection structure assembly according to claim 7, wherein said first metal layer is selected from the group consisting of gold, platinum, silver, copper, nickel, and alloys of these metals.

15. The connection structure assembly according to claim 7, wherein said second metal layer is selected from the group consisting of indium, lead, tin, bismuth, and alloys of these metals.

16. The connection structure assembly of claim 7, wherein said first metal layer is gold and the second metal layer is indium.

17. A connection structure assembly constituted by a semiconductor chip onto a substrate, comprising:
   a semiconductor chip;
   a substrate having a solder portion formed thereon, said solder portion comprising a lead/tin solder;
   a first metal layer formed in connection with said semiconductor chip to keep said semiconductor chip apart from said substrate in a predetermined distance;
   an indium layer formed on said first metal layer, said indium layer having a melting point lower than that of said first metal layer, wherein said indium layer does not degrade the connection reliability when reacted with the lead/tin solder portion formed on said substrate at the time of reflow heating of the lead/tin solder portion to connect said semiconductor chip with said first metal layer and indium layer is placed in contact with the substrate with said lead/tin solder portion to form said connection structure assembly;
   wherein a ratio V2/V1 of the volume (V2) of the indium layer to the volume (V1) of said first metal layer is 0.2 to 5.0.

* * * * *